(12) United States Patent
Wang et al.

(10) Patent No.: US 9,230,635 B1
(45) Date of Patent: Jan. 5, 2016

(54) MEMORY PARAMETRIC IMPROVEMENTS

(71) Applicant: Inphi Corporation, Santa Clara, CA (US)

(72) Inventors: David T. Wang, Santa Clara, CA (US); Andrew Burstein, Santa Clara, CA (US)

(73) Assignee: INPHI CORPORATION, Santa Clara, CA (US)

( * ) Notice: Subject to any disclaimer, the term of this patent is extended or adjusted under 35 U.S.C. 154(b) by 160 days.

(21) Appl. No.: 13/787,350

(22) Filed: Mar. 6, 2013

Related U.S. Application Data

(60) Provisional application No. 61/607,218, filed on Mar. 6, 2012.

(51) Int. Cl.
  G06F 12/02 (2006.01)
  G11C 11/406 (2006.01)
  G06F 11/22 (2006.01)

(52) U.S. Cl.
  CPC .......... *G11C 11/40607* (2013.01); *G06F 11/22* (2013.01)

(58) Field of Classification Search
  CPC ................................................ G11C 11/40607
  See application file for complete search history.

(56) References Cited

U.S. PATENT DOCUMENTS

| | | |
|---|---|---|
| 5,592,612 A | 1/1997 | Birk |
| 6,128,094 A | 10/2000 | Smith |
| 6,400,621 B2 | 6/2002 | Hidaka et al. |
| 6,484,278 B1 | 11/2002 | Merritt et al. |
| 6,486,493 B2 | 11/2002 | Arimoto et al. |
| 6,542,956 B1 | 4/2003 | Lee et al. |
| 6,601,130 B1 | 7/2003 | Silvkoff et al. |
| 6,898,142 B2 * | 5/2005 | Takahashi ...................... 365/222 |
| 6,980,427 B2 | 12/2005 | Garnett et al. |
| 6,993,701 B2 | 1/2006 | Corbett et al. |
| 7,193,844 B2 | 3/2007 | Garnett et al. |
| 7,359,261 B1 | 4/2008 | Wu et al. |
| 7,379,361 B2 | 5/2008 | Co et al. |
| 7,656,727 B2 | 2/2010 | Thayer |
| 7,990,746 B2 | 8/2011 | Rajan |
| 8,325,554 B2 | 12/2012 | Sweere et al. |
| 8,631,194 B2 * | 1/2014 | Wakasa ......................... 711/106 |

(Continued)

OTHER PUBLICATIONS

Office Action for U.S. Appl. No. 13/653,373, dated Mar. 27, 2014.

(Continued)

*Primary Examiner* — Charles Rones
*Assistant Examiner* — Ryan Dare
(74) *Attorney, Agent, or Firm* — Richard T. Ogawa; Ogawa P.C.

(57) ABSTRACT

A method for manufacturing a dynamic random access memory device is provided. The method includes fabricating a dynamic random access memory device having a plurality of memory cells. Each of the memory cells has a refresh characteristic that meets or exceeds a refresh specification provided for a DDR3 SDRAM device or a DDR4 SDRAM device. The method includes testing the dynamic random access memory device. The testing includes determining the refresh characteristic for each of the memory cells, classifying each of the memory cells as a good memory cell or a bad memory cell based upon the refresh characteristic, identifying each of the bad memory cells, and storing an address location for each of the bad memory cells. The method then includes transferring the address location for each of the bad memory cells into an address match table.

22 Claims, 11 Drawing Sheets

(56) References Cited

U.S. PATENT DOCUMENTS

| | | |
|---|---|---|
| 8,687,451 B2 | 4/2014 | Wang |
| 2003/0048613 A1 | 3/2003 | Garnett et al. |
| 2004/0032772 A1* | 2/2004 | Takahashi ............ 365/202 |
| 2004/0123029 A1 | 6/2004 | Dalal et al. |
| 2004/0138868 A1 | 7/2004 | Kuznetsov et al. |
| 2004/0184329 A1* | 9/2004 | Horiguchi et al. ........... 365/200 |
| 2004/0243879 A1* | 12/2004 | Hou et al. ............. 714/8 |
| 2005/0010709 A1 | 1/2005 | Davies et al. |
| 2006/0179369 A1* | 8/2006 | Bravo et al. .......... 714/718 |
| 2006/0200697 A1 | 9/2006 | Ito |
| 2008/0104290 A1 | 5/2008 | Cowell et al. |
| 2008/0183959 A1 | 7/2008 | Pelley et al. |
| 2009/0055665 A1 | 2/2009 | Maglione et al. |
| 2009/0141558 A1 | 6/2009 | Sarin et al. |
| 2009/0300259 A1 | 12/2009 | Luo et al. |
| 2010/0005212 A1 | 1/2010 | Gower et al. |
| 2010/0162037 A1 | 6/2010 | Maule et al. |
| 2010/0174955 A1* | 7/2010 | Carnevale et al. ............ 714/718 |
| 2010/0199125 A1 | 8/2010 | Reche |
| 2010/0274952 A1 | 10/2010 | Lee |
| 2011/0029752 A1 | 2/2011 | Sutardja et al. |
| 2011/0072200 A1 | 3/2011 | Lee et al. |
| 2011/0125990 A1 | 5/2011 | Khosravi et al. |
| 2011/0170329 A1 | 7/2011 | Kang |
| 2011/0208900 A1* | 8/2011 | Schuette et al. ............. 711/103 |
| 2011/0307647 A1 | 12/2011 | Stalzer |
| 2012/0079182 A1* | 3/2012 | Bains ............... 711/106 |
| 2012/0089854 A1 | 4/2012 | Breakstone et al. |
| 2012/0124186 A1 | 5/2012 | Emerson et al. |
| 2012/0151294 A1 | 6/2012 | Yoo et al. |
| 2012/0243299 A1 | 9/2012 | Shau |
| 2012/0257459 A1 | 10/2012 | Berke |
| 2012/0297231 A1 | 11/2012 | Qawami et al. |
| 2013/0016574 A1* | 1/2013 | Kim et al. ................ 365/189.07 |
| 2013/0060996 A1 | 3/2013 | Berke |

OTHER PUBLICATIONS

Notice of Allowance for U.S. Appl. No. 13/558,332, dated Feb. 25, 2014.
Office Action for U.S. Appl. No. 13/620,288, dated Oct. 1, 2013.
Office Action for U.S. Appl. No. 13/791,814, dated May 1, 2014.
Office Action for U.S. Appl. No. 13/619,692, dated May 14, 2014.
Office Action for U.S. Appl. No. 13/620,288, dated May 16, 2014.
Office Action for U.S. Appl. No. 13/791,807, dated May 29, 2014.
Office Action for U.S. Appl. No. 14/178,241, dated Jun. 27, 2014.
Office Action for U.S. Appl. No. 13/791,124, dated Sep. 2, 2014.
Office Action for U.S. Appl. No. 13/791,124, dated Dec. 4, 2014.
Notice of Allowance for U.S. Appl. No. 13/778,531, dated Sep. 4, 2014.
Office Action for U.S. Appl. No. 13/620,288, dated Sep. 12, 2014.
Office Action for U.S. Appl. No. 13/653,373, dated Sep. 16, 2014.
Office Action for U.S. Appl. No. 13/782,348, dated Oct. 3, 2014.
Notice of Allowance for U.S. Appl. No. 13/787,282, dated Oct. 8, 2014.
Notice of Allowance for U.S. Appl. No. 13/787,350, dated Oct. 8, 2014.
Office Action for U.S. Appl. No. 13/689,986, dated Oct. 21, 2014.
Notice of Allowance for U.S. Appl. No. 13/689,986, dated Dec. 10, 2014.
Notice of Allowance for U.S. Appl. No. 13/791,807, dated Oct. 23, 2014.

* cited by examiner

| Rank ID | Bank ID | Row Address | Column Address | | Spare ID |
|---|---|---|---|---|---|
| 0 | 3 | 0x0A81 | 0x00C1 | | 0 |
| 0 | 3 | 0x1BC1 | 0x01E0 | | 1 |
| 1 | 0 | 0x0C03 | 0x032D | | 1 |
| 1 | 1 | 0x0047 | 0x0004 | | 0 |
| 1 | 1 | 0x0161 | 0x00CC | | 0 |
| 1 | 2 | 0x1958 | 0x006E | | 0 |
| 1 | 2 | 0x04DA | 0x01E9 | | 1 |
| 1 | 3 | 0x098C | 0x000E | | 1 |

FIGURE 2

| Density | | 2 Gb | 4 Gb | 8 Gb | 16 Gb | |
|---|---|---|---|---|---|---|
| 1X Refresh | $t_{RFC1}$ | 160 | 260 | 350 | 500 | ns |
| | BW Loss | 2.05% | 3.33% | 4.48% | 6.40% | |
| | Lat. Impact | 1.64 | 4.33 | 7.84 | 16.00 | ns |
| 2X Refresh | $t_{RFC2}$ | 110 | 160 | 260 | 350 | ns |
| | BW Loss | 2.82% | 4.10% | 6.66% | 8.96% | |
| | Lat. Impact | 1.55 | 3.28 | 8.65 | 15.68 | ns |
| 4X Refresh | $t_{RFC4}$ | 90 | 110 | 160 | 260 | ns |
| | BW Loss | 4.61% | 5.63% | 8.19% | 13.31% | |
| | Lat. Impact | 2.07 | 3.10 | 6.55 | 17.31 | ns |

FIGURE 7

MEMORY PARAMETRIC IMPROVEMENTS

CROSS-REFERENCES TO RELATED APPLICATIONS

The present application claims priority to and incorporates by reference, for all purposes, the following patent application: U.S. Provisional Pat. App. No. 61/607,218 filed Mar. 6, 2012, commonly assigned.

BACKGROUND OF THE DISCLOSURE

The present invention relates generally to solid state memory techniques. More particularly, the present invention provides methods and devices for repairing a "bad memory cell" with a substitute cell for a memory device such as a dynamic random access memory ("DRAM") device or others.

In memory systems, two general classes of memories exist. Such classes include low latency memories. The low latency memories have effectively infinite endurance or usage-cycles and do not degrade with respect to age or repeated accesses. Additionally, such classes also include relatively longer latency memories that do not have infinite endurance or usage cycles, and may degrade with respect to age or repeated accesses. In the case of the relatively long latency memories, sophisticated multi-error detection and correction algorithms have been implemented to correct for data cells that can degrade over the lifetime of the device due to aging effects or repeated accesses. In the case of low latency memories such as DRAM devices, however, effectively infinite endurance or usage-cycles are assumed so once weak bits or bad bits are mapped out by the device manufacturer, no errors should occur due to degradation of data cells due to aging effects or repeated accesses.

As is known, the conventional DRAM memory cell has an access transistor and a storage capacitor. The access transistor connects with the storage capacitor to a bitline when switched-on such that the capacitor stores the logic value placed on the bitline. Due to the tendency of a capacitor to lose its charge over time, DRAM memory cells must be periodically 'refreshed', which serves to maintain the value stored in each storage capacitor at its desired value. The amount of time that a cell can retain its logic value is referred to as its "data retention time".

A trend in the development of memory cells is that the cells have been shrinking due to advancements in process technology and the demand for ever larger memory capacity. This necessarily results in a reduction in the sizes of the access transistor and storage capacitor, which can lead to several limitations. For example, each access transistor exhibits leakage which acts to slowly drain stored charge from the storage capacitor. This leakage characteristic—and thus each cell's data retention time—varies from transistor to transistor; however, this variability increases as the size of the access transistors is reduced. Another problem is that a shrinking memory cell results in a smaller storage capacitor, and thus a reduced storage capacitance. This can also adversely affect the data retention time characteristics of the cells.

BRIEF SUMMARY OF THE INVENTION

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

In an example, the present invention provides dynamic random access memory devices and methods of manufacture thereof. The present invention also provides a method and system for repair techniques to replace parametrically poorest (e.g., bad cells) cells in a memory array. Once these weak bits or cells are mapped out, better parameters can be reported to the host memory controller to enable improvements in overall system performance. As used herein, the term "parametric" is a branch of statistics that assumes that the data has come from a type of probability distribution and makes inferences about the parameters of the distribution.

In an example, the present method and system can be configured either in an SRAM-in-Buffer (SiB) technique described in U.S. Provisional App. No. 61/483,868 filed May 9, 2011 and the present application herein or an Externally-controllable Spare Column (ESC) technique described in U.S. provisional App. No. 61/535,780 filed Sep. 16, 2011, each of which is commonly assigned and hereby incorporated by reference herein. In an example, the present invention provides for methods and systems for applying "repair" to the weakest cells that still pass previous specifications under a DDR3 SDRAM device or a DDR4 SDRAM device under Joint Electron Devices Engineering Council (JEDEC). Other repair techniques that remap individual addresses or groups of addresses from one cell location to another memory cell, either in the same memory integrated circuit or in different memory integrated circuits is included. In an example, the repair technique can be done at manufacturing time, die assembly time, module or board assembly time, or in the field, or other combinations thereof.

As an example, the present technique can be applied to replace memory cells or circuits that are the worst at any electrical or timing parameter or parameters, such as leakage, resistance, write times, read times, or offsets, or combinations thereof, or the like. In an example, refresh-time improvement can be used as an example for the parametric improvements of DRAM using the repair techniques. In another example, increasing refresh time by eliminating the cells with the lowest retention time is another application. As an example, benefits can be achieved using the present method and system. Examples of benefits include increased bandwidth, reduced latency, increased reliability, reduced power consumption, and others. As an example, the technique can be applied to other types of solid state memory in addition to DRAM, such as SRAM, phase change RAM, resistive RAM, and Flash, or combinations thereof, and the like.

In an embodiment, the present invention provides a method of manufacturing a dynamic random access memory device. The method can include fabricating a DRAM device having a plurality of memory cells. Each of the memory cells can have a refresh characteristic that meets or exceeds a refresh specification provided for a DDR3 SDRAM or a DDR4 SDRAM device. The DRAM device can be tested. This testing can occur in various phases, such as on an unpackaged DRAM, a packaged DRAM, a memory module, packaged DRAMs in a system, or the like.

The refresh characteristic can be determined for each of the memory cells. Each of the memory cells can be classified as a good memory cell or bad memory cell based upon the refresh characteristic. The bad memory cells can then be identified. An address location of each of these bad memory cells can be stored and transferred to an AMT (Address Match Table).

In a specific embodiment, the classification of each of the memory cells can include classifying a first group of bad memory cells according to the refresh specification and classifying a second group of bad memory cells according to a predetermined refresh characteristic range within the refresh specification to form a revised group of bad memory cells. This revised group of bad memory cells can be the sum of the first group and second group, and their addresses can be stored and sent to the AMT.

As described previously, the predetermined refresh characteristic range can relate to a number of timing or refresh characteristics based on the chosen parameter. The range can be characterized by a number of memory cells between a lower end of the range and an upper end of the range where the number of bad memory cells are equal or less to an amount of available memory cells in a group of spare memory cells as well. The address locations of each of the first and second groups of memory cells can be stored in the AMT for cell repair processes. The addresses can be retrieved from the AMT and can be used to reconfigure the memory device based upon the weak cell list using a "repair" or "replacement" method.

In an embodiment, the present invention provides a DRAM device comprising a plurality of regular address inputs, at least one spare address input, a plurality of control inputs, a plurality of data inputs, a plurality of data outputs, a plurality of memory arrays, and a spare group of memory cells. Each of the memory arrays can have a plurality of memory cells, each of which can be coupled to a data input and output. The spare group of memory cells can include a plurality of spare memory cells being externally addressable using an AMT and configured with a spare address input. The spare address input can be coupled to the AMT to access the spare memory cells.

Furthermore, the plurality of memory arrays can include a plurality of first and second memory cells and first and second addresses. Each of the first memory cells can have a refresh characteristic outside of a specification for a DRAM device. Each of the second memory cells can have a refresh characteristic within the specification of the DRAM device and outside of a predetermined refresh characteristic range characterized to eliminate accesses to the plurality of second memory cells not meeting the predetermined refresh characteristic range. The first group can be those cells that do not meet conventional specifications, and the second group can be those cells that do not meet the optimization specifications.

In a specific embodiment, the spare group of memory cells can be selected from a spare column, a spare row, or a spare bank. The spare group of memory cells can also include a first through seventh spare column, and the spare address input can include a first through third spare address input. The at least one spare address input can include one of three unused column address inputs A11, A13, and A17.

During the selected mode, at least one of the spare memory cells is accessed from the group of memory cells using the spare address input. During a read operating, data from the accessed spare memory cell is transferred to one of the plurality of data outputs. During a write operation, data from one of the plurality of data inputs is transferred into the accessed spare memory cell. During the unselected mode, the spare address input is inactive, and the plurality of regular address inputs is active.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

Various additional objects, features and advantages of the present invention can be more fully appreciated with reference to the detailed description and accompanying drawings that follow.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 2 illustrates a simplified Address Match Table according to an embodiment of the present invention.

FIG. 7 illustrates a simplified table of memory refresh characteristics according to conventional memory devices.

DETAILED DESCRIPTION OF SPECIFIC EMBODIMENTS OF THE DISCLOSURE

A trend in the development of memory storage devices is that as the storage cells continue to shrink due to advancements in process technology, storage cells in low latency memories such as DRAM devices may become more susceptible to errors that occur due to aging effects or repeated accesses. Moreover, the number of weak bits due to natural process variations will continue to increase. Accordingly, it is desirable that spare storage cells can be utilized to correct for the presence of faulty storage cells in low latency memory that may develop over the lifetime of the device.

The present invention is related to memory devices for electronic applications. More specifically, embodiments of the present invention provide memory interface devices and memory IC (integrated circuit) devices, which can be implemented various computing devices, servers, and the like. Merely by way of example, these devices can be configured for or implemented as memory devices, such as SDRAM, DDR SDRAM, RDRAM, SRAM, and Flash devices, and the like. But it will be recognized that the invention as a much broader range of applicability.

A system and method are provided for replacing faulty or weak memory storage cells in a memory system through the use of an enhanced memory interface circuit or enhanced memory controller device and the use of redundant memory storage cells.

The present invention provides for a method that may be implemented in different ways for different systems. An implementation is described herein as an illustrative example. The example should not be construed as limiting the scope of the claims according to the present invention.

In an example, the present techniques provide for support of weak cell management in DRAM devices. It is believed that as DRAM process technology continue to advance, DRAM cell storage capacitance will continue to decrease and more and more DRAM storage cells will be unable to meet specified data retention time requirements. Furthermore, as the number of weak DRAM storage cell increases, DRAM devices as a whole will be unable to provide sufficient number of redundant rows and redundant columns to continue to effect repairs and present the façade of perfect storage devices. According to the present example, the techniques provide logic devices coupled with DRAM memory cells to help healing ailing DRAM devices and mitigate the ill effects of the weak DRAM cells. Further details of the present system and method can be found throughout the present specification and more particularly below.

EXAMPLE

Figure 1:
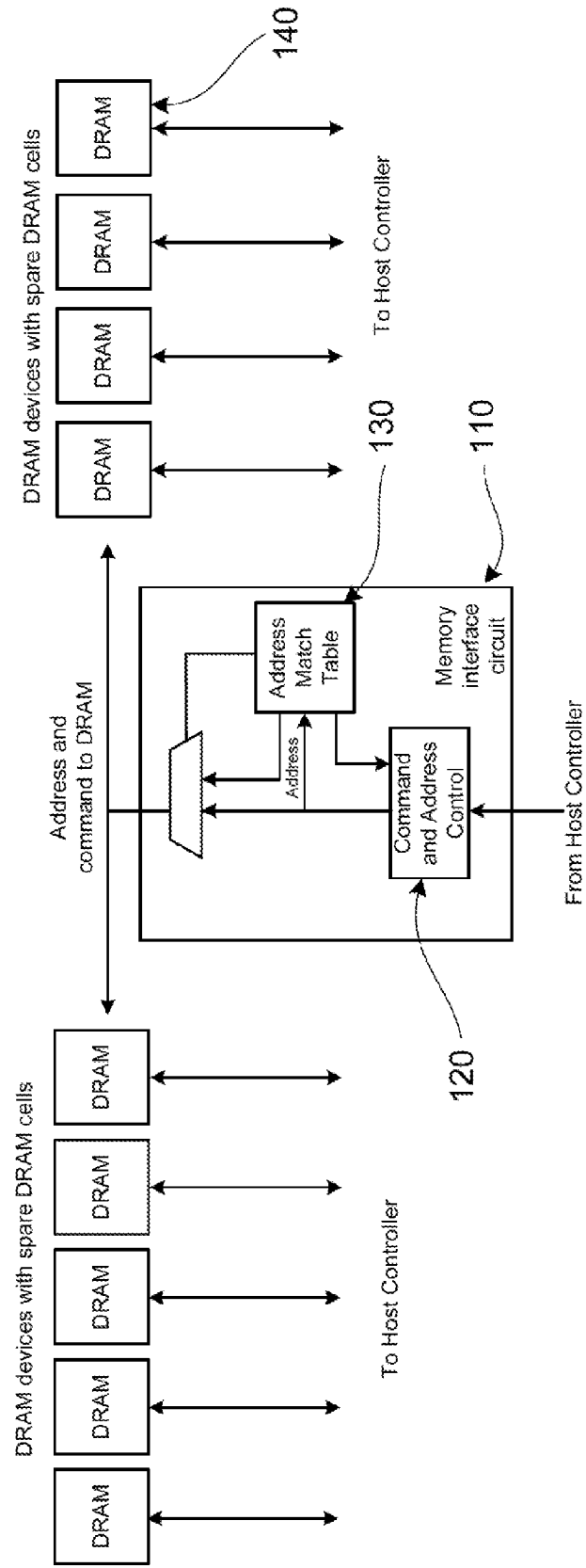
FIG. 1 illustrates a simplified block diagram of an interface circuit according to an embodiment of the present invention.

Utilizing an Address Match Table in Memory Interface Circuit, Controlling Spare Memory Storage Cells to Dynamically Replace Faulty Storage Cells in Memory Devices, as illustrated by FIG. 1.

FIG. 1 shows an example of use of an enhanced interface circuit that, in combination with spare cells in DRAM devices, can function to replace faulty memory locations in the DRAM devices. In FIG. 1, an enhanced memory interface circuit, labeled as 110 is shown to contain a command and address control unit, labeled as 120, and an Address Match Table, labeled as 130. The enhanced memory interface circuit re-drives addresses and commands from the host controller to the DRAM devices, one of which is labeled as 140 in FIG. 1. The DRAM devices contain spare DRAM cells, the addresses of which the enhanced memory interface circuit can select and effect the replacement of faulty or weak storage cell locations, as illustrated by the Table in FIG. 2.

As an example, the DRAM device may include a plurality of memory cell arrays, a plurality of switch blocks, and a plurality of sensing amplifying units. Each of the memory cell arrays includes at least one memory cell, and each memory cell may be connected to a word line and a bit line. Of course, other features exist with the DRAM device.

FIG. 2 shows an example of the Address Match Table, labeled as 130 in FIG. 1. FIG. 2 shows that the Address Match Table contains addresses of faulty memory storage cells. In the case of FIG. 2, the addresses are listed in terms of DRAM address formats: Rank ID, Bank ID, Row Address and Column Address. The reference spare ID can be "0" or "1," although there can be variations. The spare ID may be used to indicate data bus offset as to select subset(s) of DRAM devices to respond to the selection of a spare location. For example, the offset ID may indicate, for example, that: only the left side of the memory module should be matched against the bad memory address, only the right side of the memory module should be matched against the bad memory address, the entire width (one rank) of the memory module should be matched against the bad memory address, or a single DRAM device should be matched against the bad memory address.

In other implementations, address fields for Chip ID (CID) and Bank Group ID may also be used. The addresses of faulty or weak memory storage cells contained in the Address Match Table may be determined by testing during manufacturing or special run-time testing. The entries in the Address Match Table may also be dynamically updated during runtime if it is determined that additional memory storage locations are weak or faulty. The function of the Address Match Table is to act as a filter of addresses and commands that flow through the enhanced memory interface circuit 110. In the case that a given memory access is matched to an entry in the Address Match Table, the Address Match Table replaces the address of the memory access with the address of a spare memory location. In this manner, the existence of the faulty or weak memory address is hidden from the host memory controller, and the enhanced memory interface circuit enables the memory devices to present a contiguous memory address space without faulty or weak cell locations, as shown in FIG. 3.

Figure 3:
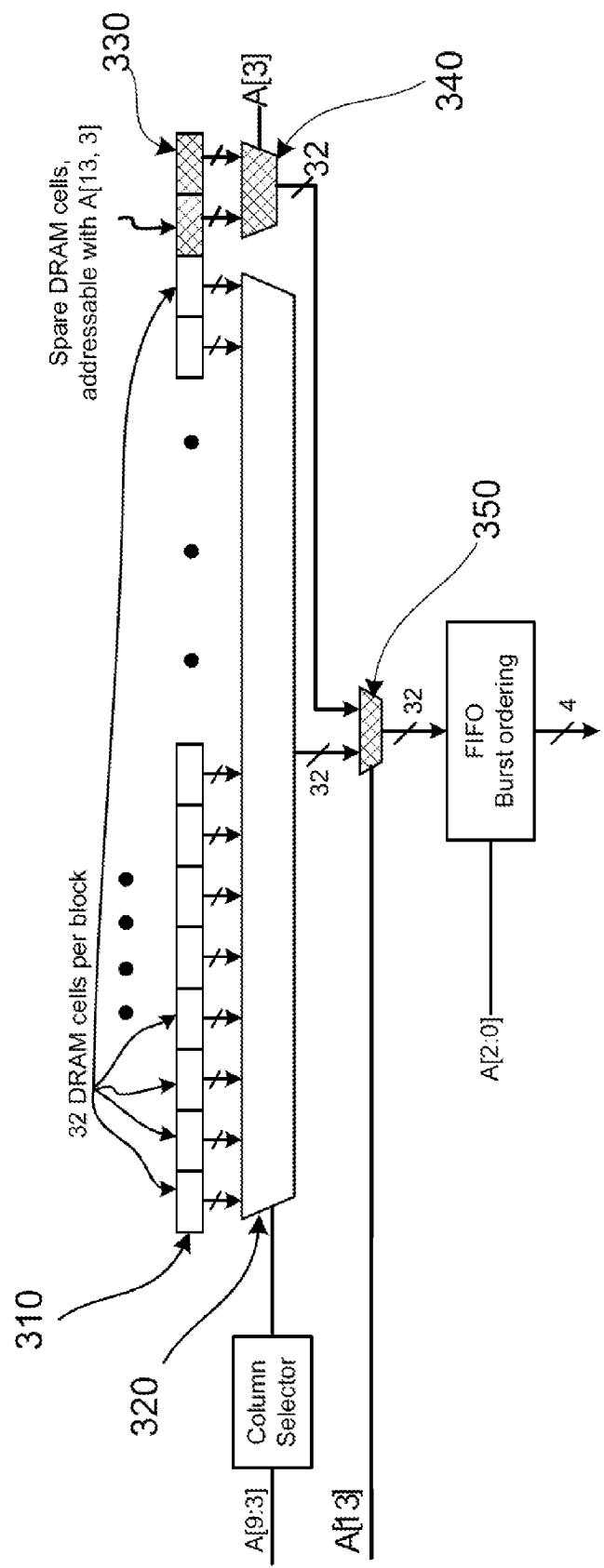
FIG. 3 illustrates a simplified diagram of spare memory cells in a DRAM device according to an embodiment of the present invention.

FIG. 3 shows an exemplary implementation of spare memory cells in a DRAM device. The spare memory storage cells are arranged in terms of added columns for each row. FIG. 3 shows a row of DRAM storage cell organized as blocks, with 32 DRAM cells per block. A block of 32 DRAM storage cells is labeled as 310 in FIG. 3. FIG. 3 also shows that in the exemplary DRAM device, column addresses A [9:3] are used to select between different blocks of DRAM storage cells through a block of circuits collectively labeled as a large multiplexor. The large multiplexor is labeled as 320 in FIG. 3. FIG. 3 also shows the implementation of two blocks of spare DRAM cells, labeled as 330. FIG. 3 further illustrates that the two blocks of spare DRAM cells can be separately selected through the use of the column address A[3] through a multiplexor circuit labeled as 340. Finally, the column address A[13] can be used to select between data from the baseline memory array or data from the spare memory cells through the multiplexor labeled as 350 in FIG. 3.

To prove the principle and operation of the present techniques, examples have been prepared. These examples are merely for illustration purposes and should not unduly limit the scope of the claims herein. One of ordinary skill in the art would recognize many variations, alternatives, and modifications.

To assist the reader, the following terms are defined as examples.

AMT: Address Match Table
CID: Chip ID
IFR: In-Field Repair
LRDIMM: Load-Reduced Dual Inline Memory Module
MB: Memory Buffer
MemBIST: Software tool to generate built in self test blocks for a memory matrix as a
VHDL model for the whole memory system.
RCD: Registering Clock Driver, Also known more simply as the "Register"
RDIMM: Registered Dual Inline Memory Module RID: Rank ID
SPD: Serial Presence Detect
VRT: Variable Retention Time
WBA: Weak Bit Address
WBAL: Weak Bit Address List
WCM: Weak Cell Management In an example, techniques include a method that is provided within a framework wherein DRAM devices are characterized, weak cells within the DRAM devices are detected, their address locations stored in non-volatile memory locations, and the subsequent usage of the Weak Bit Address list to effect dynamic repairs that are transparent to the host memory controller. The section on MemBIST will provide descriptions of testing algorithms to detect weak cells, and the section on Weak Bit Address List storage format will specify their storage format in non-volatile memory, and the sections that describe specific repair concepts will detail the usage of the Weak Bit Address List to effect weak cell management.

In an example, the present description provides a high level architectural specification that is independent of specific DRAM types, specific DIMM types, and specific weak bit replacement concepts. It is intended that this specification will act as the master specification from which an implementation-specific architectural specification may be quickly derived.

In an example, the Externally-Addressable-Spare-Columns-in-DRAM concept is designed for implementation on a DDR3 or DDR4 Register DIMM (RDIMM) or LRDIMM. The Externally-Addressable-Spare-Columns-in-DRAM concept also utilizes a known Weak Bit Address List (WBAL) stored in one or more Address Match Tables (AMT) to compare against addresses of DRAM commands that flow through the Address and Command Path of the RDIMM or LRDIMM. In the case that a match to a known Weak Bit Address, the Address Match Table replaces the column-address of the Column-Access command with a column-address to a set of spare columns in the DRAM devices. The spare-columns are used to provide reliable storage locations for data in place of columns with known faulty or weak DRAM storage cells.

Figure 4:
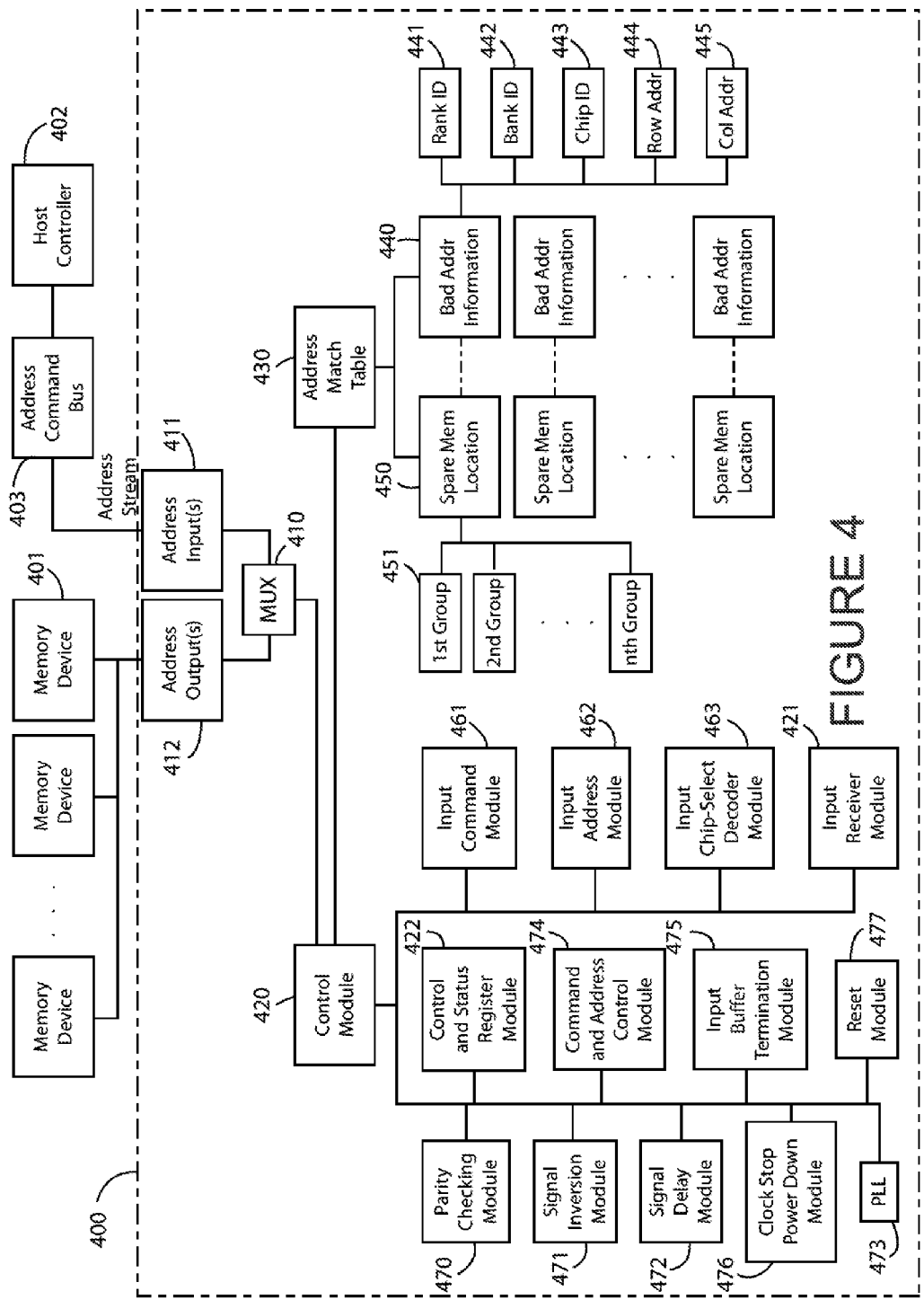
FIG. 4 illustrates a simplified block diagram of a memory interface device according to an embodiment of the present invention.

In an example, FIG. 4 illustrates a DDR4 Registered DIMM where the DDR4 Register has been modified to incorporate one or more Address Match Tables. The Address Match Tables check addresses of DRAM commands as the DRAM commands flow through the DDR4 Register against known Weak Bit Address locations. In the case of an address match, the DDR4 Register dynamically replaces the column-address of the column-access command with the address of a spare column in DRAM devices.

To facilitate the implementation of the Spare-Columns-in-DRAM concept the architectural description of the Address Match Table and Externally-Addressable-Spare-Columns-in-DRAM may be found in the following sections (1) Address Match Table; (2) Externally-Addressable-Spare-Columns-in-DRAM.

In an embodiment, the present invention provides a memory interface device. As shown in FIG. 4, the device 400 can include address input(s) 411, address output(s) 412, an address match table 420, a control module 430, and a multiplexer 410. In a specific embodiment, the memory interface device 400 can be selected from a register device, a buffer device, an advanced memory buffer, a buffer on-board, or the like and combinations thereof The address input(s) 411 can be configured to receive address information from an address stream of a host controller, while the address output(s) 412 can be coupled to a plurality of memory devices and be configured to drive address information. In a specific embodiment, the plurality of memory devices 401 can include a plurality of DRAM devices, Flash devices, or other like memory devices. Furthermore, the multiplexer 410 can be coupled to the address input and the address output.

The address match table 430 can include an array of SRAM cells, or the like. In a specific embodiment, this address match table 430 can include a plurality of bad address information 440 and a plurality of spare memory locations 450. Each of the plurality of bad address information 440 can be associated with one of the plurality of spare memory locations 450. Each of the plurality of bad address information can include a rank ID 441, a bank ID 442, a chip ID 443, a row address 444, and a column address 445. Additional parameters can also be included. Each of the plurality of spare memory locations can include a plurality of memory groups 451, which can include a first column, second column, and an nth column. Row and bank configurations can also be used, as various numbers and configurations of spare memory locations can be used depending on design and related applications. The address match table can be configured to receive bad address information and can be configured to transfer the spare memory location to replace the bad address associated with the bad address information.

The control module 420 can be a command and address module, or the like. This control module 420 can be integrated with the address match table. In a specific embodiment, this control module 420 can be configured to determine address information from an address stream from an address command bus 403 coupled to a host controller 402 during a run time operation. This control module 420 can be configured to compare each address from the address steam and configured to determine whether each address matches with a stored address in the address match table 430 to identify a bad address. The control module 420 can also be configured to replace the bad address with the revised address of the spare memory location 450.

In a specific embodiment, the control module 420 can include an input receiver module 421 or a control and status register module 422. The control module can also include an input command 461, an input address 462, and an input chip-select decoder module 463. Other components, such as a parity checking module 470, a signal inversion module 471, a signal delay module 472, a PLL (Phase-locked loop) 473, a command and address control module 474, an input buffer termination module 475, a clock stop power down module 476, a reset module 477, and the like, can also be included with the memory interface device 400.

In a specific embodiment, the memory interface device can be coupled to a plurality of DRAM devices. Each of these DRAM devices can include a plurality of address inputs, a plurality of control inputs, a plurality of data input/outputs, a plurality of memory arrays, and a spare group. Each of the plurality of memory arrays can include a plurality of memory cells, each of which can be coupled to a data input/output. The spare group can include a plurality of spare memory cells. Each of these spare memory cells can be externally addressable using the address match table. Furthermore, the spare group can include a spare row, a spare column, or a spare bank.

Figure 5:
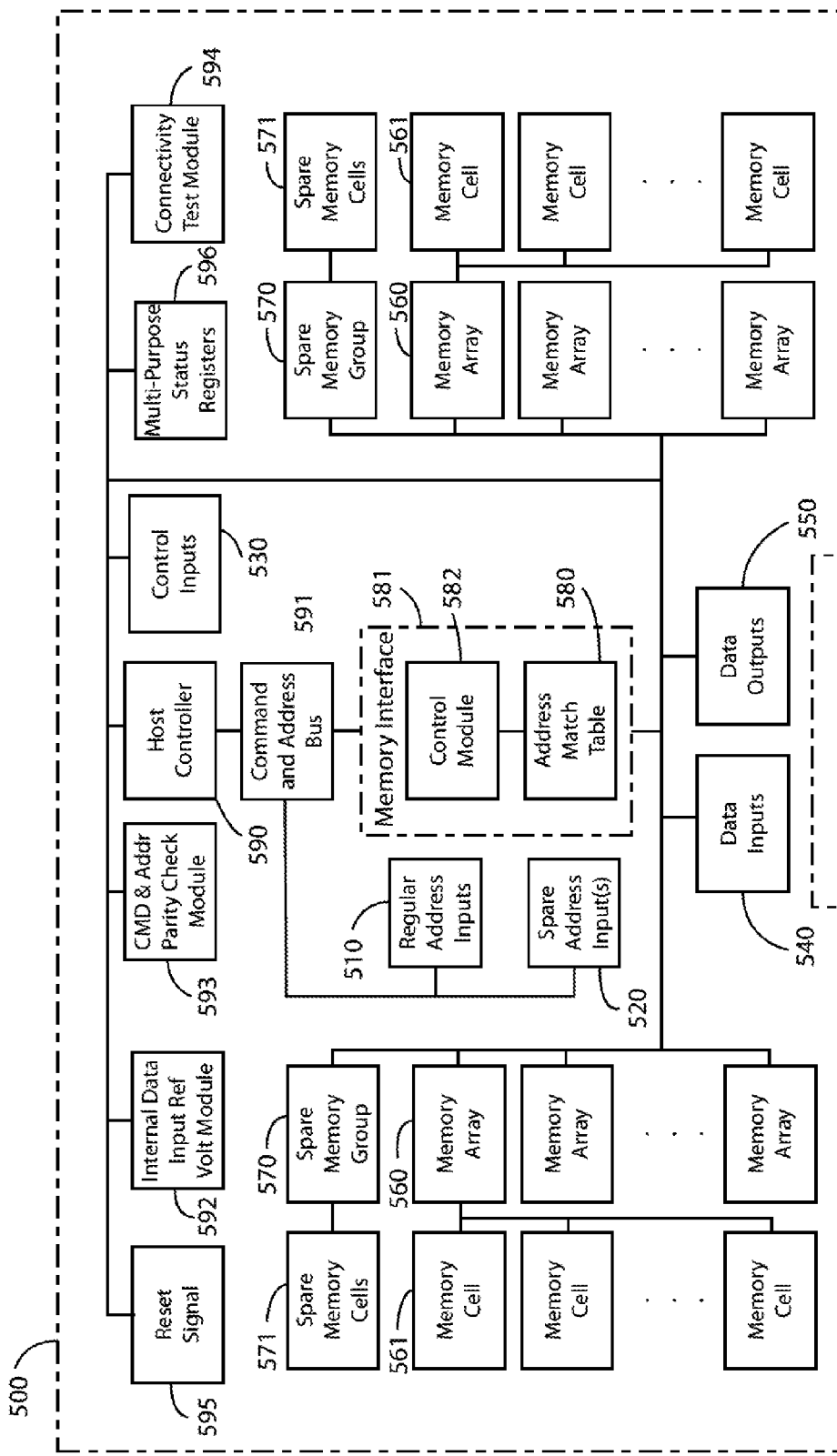
FIG. 5 illustrates a simplified block diagram of a memory integrated circuit device according to an embodiment of the present invention.

FIG. 5 illustrates a simplified block diagram of a memory integrated circuit device according to an embodiment of the present invention. As shown, this device 500 can include a plurality of regular address inputs 510, at least one spare address 520 configured for a selected mode or an unselected mode, a plurality of control inputs 530, a plurality of data inputs 540, a plurality of data outputs 550, a plurality of memory arrays 560, and a spare group of memory cells 570.

In a specific embodiment, each of the plurality of memory arrays 560 can include a plurality of memory cells 561. Each of these memory cells can be coupled to a data input/output 540/550. Also, the spare group of memory cells 570 can include a plurality of spare memory cells 571. The spare group of memory cells 571 can include a spare column, a spare row, a spare bank, or the like. Each of these memory cells 571 can be externally addressable using an address match table 580 and can be configured with the spare address input 520. The spare address input 520 can be coupled to the address match table 580 to access the spare memory cells 571. The address match table 580 can be provided within a memory interface device 581 with a control module 582. This memory interface 581 can be similar to that described for FIG. 4 above. In a specific embodiment, the spare address input 520 can include one of three unused column address inputs A11, A13, and A17.

In a specific embodiment, the plurality of spare memory cells 571 can be accessed from the group of memory cells 570 using the spare address input 520 during the selected mode. During a read operation, data from the accessed spare memory cell 571 can be transferred to one of the plurality of data outputs 550. During a write operation, data from one of the plurality of data inputs 540 can be transferred into the accessed spare memory cell 571. During the unselected mode, the spare address input 520 can remain inactive while the plurality of regular address inputs 510 remains active.

Also, the spare group of memory cells 570 can include various configurations of spare columns and spare address inputs. For example, the spare group 570 can include first through seventh spare columns, and the spare address input can include first through third spare address inputs. Or, the spare group can include first through third spare columns, and the spare address input can include a first and second spare address input. Other variations, modifications, and alternatives to these configurations can be used.

The memory integrated circuit device 500 can also include an encoded command and address bus 591 having a shared command signal and an address signal, an internal data input reference voltage circuit 592, a command and address parity checking circuit 593 a set of circuits designed to support connectivity testing 594, a reset input signal 595, a set of multi-purpose status registers 596 configured to be read out, or the like and combinations thereof. These modules and circuits can be coupled to a host controller 590. Those of ordinary skill in the art will recognize other variations, modifications, and alternatives.

Many benefits are achieved by way of the present invention over conventional embodiments and techniques. For example, embodiments of a memory IC device can have improved performance and lifetime. Embodiments of a memory interface device can facilitate the "repair" of bad or faulty memory cells, or even undesirable memory cells due to aging, deterioration, or the like. Spare memory cells from a memory IC device can be rerouted via a memory interface device upon detection of predetermined characteristics of memory cell to be replaced. These implementations provide several means of maintaining or improving memory performance, which can be tailored depending on various hardware and/or software requirements of specific applications.

In an example, the present invention provides a method for operating a memory interface device, as outlined below.
1. Receive, at an address input(s) of a memory interface device, address information from an address stream of a host computer;
2. Process the address stream from an address command bus coupled to the host controller during a run time operation;
3. Compare successively each address from the address stream from information in an address match table to determine to whether an address matches with a stored address in an address match table;
4. Identify a bad address provided in the address match table; and
5. Replace the bad address with a revised address of a spare memory location;
6. Transfer the revised address to a multiplexer coupled to the address output;
7. Drive address information from an address output(s) of the memory interface device to a plurality of memory devices; and
8. Perform other steps, as desired.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

Figure 6:
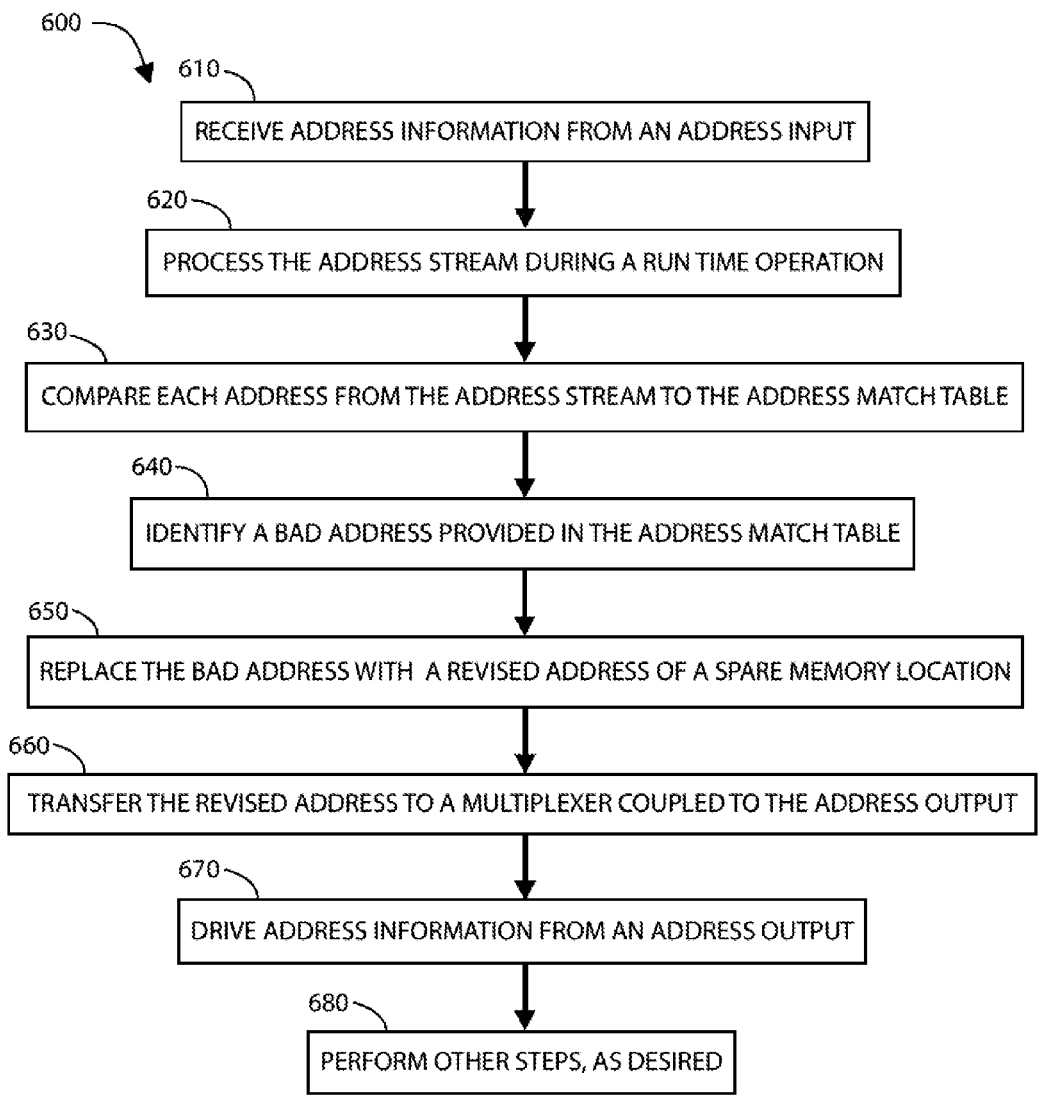
FIG. 6 illustrates a simplified flow diagram for operating the Address Match Table according to an embodiment of the present invention.

FIG. 6 illustrates a simplified flow diagram for operating an address match process for replacing a bad cell with a spare cell according to an embodiment of the present invention. As shown, method 600 can begin with receiving, at address input or inputs of a memory interface device, address information from an address stream of a host computer, step 610. This memory interface device can be coupled to a host computer. The memory interface device can be selected from a register device, a buffer device, an advanced memory buffer, or a buffer on-board. These memory devices can include a plurality of DRAM devices, Flash devices, or other like devices and combinations thereof.

During a run time operation, the address stream from an address command bus coupled to the host controller can be processed, step 620. Each address from the address stream can be compared successively to determine whether an address matches with a stored address in an address match table, step 630. The address table can include a plurality of SRAM cells and can include a plurality of bad address information and a plurality of spare memory locations. Each of these bad address locations can be associated with one of the spare memory locations. Each of the bad address information can include a rank ID, a bank ID, a chip ID, a row address, and a column address. Each of the spare memory locations can include one or more memory groups, which can include columns, rows, or banks, and the like. In a specific embodiment, each of the spare memory locations can include a first, second, and an nth column.

A bad address in the address match table can be identified, step 640, and can be replaced with a revised address of a spare memory location, step 650. The revised address can be transferred to a multiplexer coupled to the address output, step 660. The address match table can be configured to receive bad address information and transfer the spare memory location to replace the bad address associated with the bad address information. Also, method 600 can include driving address information from an address output or outputs of the memory interface device to a plurality of memory devices, step 670.

In a specific embodiment, the comparing, identifying, and replacing can be under control of a control module. This control module can be integrated with the address match table and can further include an input receiver module, a control and status register module, an input command module, and input address module, and an input chip-select decoder module, and other like modules. Further details regarding components of these devices and process are described previously for FIGS. 1-5. Furthermore, other steps can be performed as desired according to various specifications and applications, step 680.

In an example, the present invention provides dynamic random access memory devices and methods of manufacture thereof. The present invention also provides a method and system for repair techniques to replace parametrically poorest (e.g., bad cells) cells in a memory array. Once the weak bits or cells are mapped out, the cells that remain can present better parametric numbers to the host. In an embodiment, these parametric numbers can include $t_{RFC}$, $t_{RCD}$, $t_{RP}$, $t_{WR}$, etc., which can be recorded in the SPD. When the system powers up, the SPD is read to load the various stored values into the memory controller. The memory controller can then schedule commands with tighter spacing according to the improved timing parameters that have been presented, which enables improvements in overall system performance. As used herein, the term "parametric" is a branch of statistics that assumes that the data has come from a type of probability distribution and makes inferences about the parameters of the distribution.

In another embodiment, the memory controller can be a smart host controller that runs its own memory performance characterizations to attain the timing parameters and map out the weaker cells as described previously. In this case, this smart host controller can automatically attain cells that end up with better timing parameters and naturally adapt to these faster cells to get better system performance.

In an example, the present method and system can be configured either in an SRAM-in-Buffer (SiB) technique described in U.S. Provisional App. No. 61/483,868 filed May 9, 2011 and the present application herein or an Externally-controllable Spare Column (ESC) technique described in U.S. provisional App. No. 61/535,780 filed Sep. 16, 2011, each of which is commonly assigned and hereby incorporated by reference herein. In an example, the present invention provides for methods and systems for applying "repair" to the weakest cells that still pass previous specifications under a DDR3 SDRAM device or a DDR4 SDRAM device under Joint Electron Devices Engineering Council (JEDEC). Other repair techniques that remap individual addresses or groups of addresses from one cell location to another memory cell, either in the same memory integrated circuit or in different memory integrated circuits is included. In an example, the repair technique can be done at manufacturing time, die assembly time, module or board assembly time, or in the field, or other combinations thereof. The SiB technique discloses separating the memory cells into bins by retention time characteristics, and loading into an Erasable Programmable Read Only Memory (EPROM) device on boot time by a memory buffer, a linked-list structure pointing to a next bin to be refreshed according to the retention time characteristics. The bins are refreshed according to traversal of the linked list structure.

As an example, the present technique can be applied to replace memory cells or circuits that are the worst at any electrical or timing parameter or parameters, such as leakage, resistance, write times, read times, or offsets, or combinations thereof, or the like. In an example, refresh-time improvement can be used as an example for the parametric improvements of DRAM using the repair techniques. In another example, increasing refresh time by eliminating the cells with the lowest retention time is another application. As an example, benefits can be achieved using the present method and system. Examples of benefits include increased bandwidth, reduced latency, increased reliability, reduced power consumption, and others. As an example, the technique can be applied to other types of solid state memory in addition to DRAM, such as SRAM, phase change RAM, resistive RAM, and Flash, or combinations thereof, and the like.

From the JESD79-4 (DDR4 specification), it is shown that as devices achieve large densities, the refresh duration increases. The bandwidth impact (nominal $T_{CASE}$) can be shown to be a 4.5% (350/7812.5) bandwidth loss in an 8 GB device at a 1× refresh mode and an 8.2% (160/7812.5*4) bandwidth loss in an 8 GB device at a 4× refresh mode. The average latency impact of these cases are shown to be 7.84 ns ((350/7812.5)*350/2) and 6.55 ns ((160/1953.1)*160/2), respectively. This shows the increasing latency penalty with increasing DRAM device density due to refresh, which indicates serious concerns for future, high density (16+GB) DRAM devices.

FIG. 7 illustrates a simplified table of memory refresh characteristics according to conventional memory devices. This table shows a comparison of various combinations of refresh modes (1×, 2×, and 4×) and device densities (2 GB, 4 GB, 8 GB, 16 GB) and their related characteristics of the Row Refresh Cycle Time (duration of a refresh command) $t_{RFC}$, Bandwidth (BW) loss, and Latency Impact. These values can be derived from the DDR4 specification with the exception of the 16 GB density related $t_{RFC}$, which are yet to be determined. The values shown in the 16 GB column of FIG. 7 are hypothetical values that provide an estimate based on the current trend. Given these numbers, the impact of the refresh time is already significant at the 8 GB density, thus methods for refresh impact reduction are of great importance. With the projection to 16 GB device densities, refresh impact reduction is critical for future device performances.

Figure 8A:
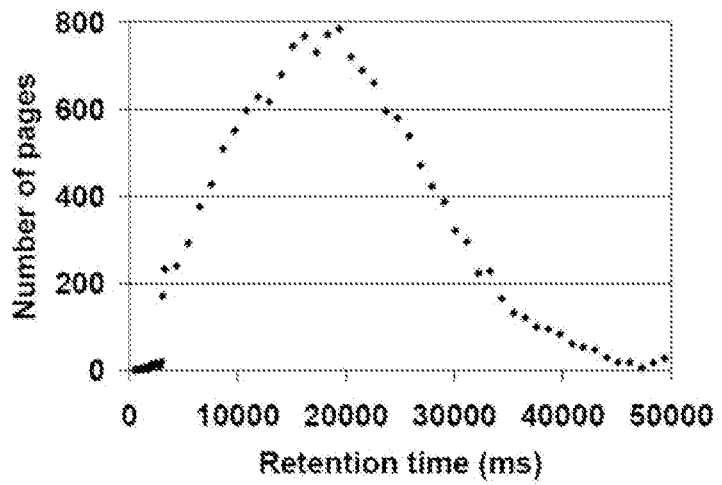
FIGS. 8A and 8B illustrate simplified graphs relating to memory retention times according to conventional memory devices.
Figure 8B:
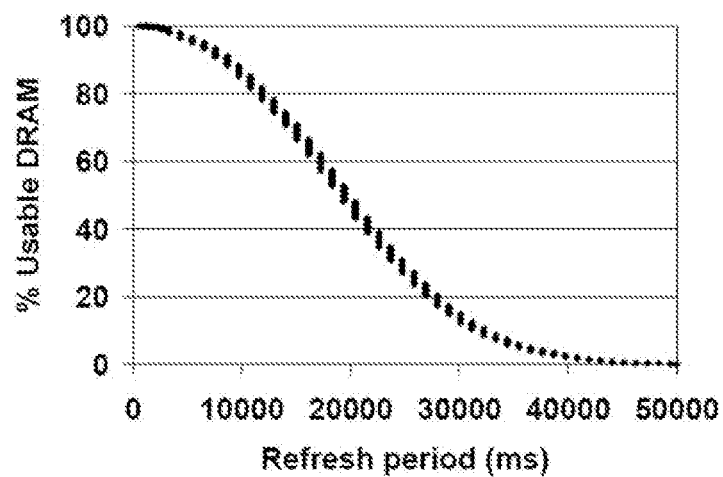

FIGS. 8A and 8B illustrate simplified graphs relating to memory retention times according to conventional memory devices. FIG. 8A shows a distribution of retention times for an entire DRAM at room temperature (24 Degrees Celsius) with the number of pages varying as a function of retention time (ms). FIG. 8B shows a cumulative distribution of the same with the percentage of usable DRAM varying as a function of refresh period (ms). These figures show that most DRAM cells can retain data for about 10 to 30 seconds. Typical DRAMs have requirements for each cell to be refreshed once every 32 or 64 ms; this includes a number of weak cells. This follows conventional specifications where 8192 refresh commands are issued every 64 ms, or about 7.8 microseconds/refresh. This $t_{RFC}$ is set very conservatively. With the imminent concerns of growing DRAM densities, the bandwidth loss, latency and power impact that are caused by $t_{RFC}$ can no longer be ignored.

Various embodiments of the present invention can allow the manufacture of DRAM devices while mapping out weak cells. When weak or bad memory bits are identified, they can be bypassed and thus no longer refreshed. Then, the time interval between refresh commands ($t_{REFI}$) can be lengthened (while preferably keeping $t_{RFC}$ unchanged), or the duration ($t_{RFC}$) of the refresh commands can be reduced (while preferably keeping $t_{REFI}$ unchanged), or both. By "repairing" or replacing these weak cells, a DRAM cell's refresh requirement can be extended from 64 ms to 512 ms or larger. This can allow a significant gain back in the loss of bandwidth and average access latency.

As an example, DRAM memory module manufacturers can test DRAM cell retention characteristics to meet more stringent data retention time characteristics compared to the existing standard (e.g. >>120 ms @ 85 Degrees Celsius). DRAM cells that do not meet the more stringent data retention time can be mapped out as weak cells, which can then be replaced by weak cell replacement methods and systems as described within the present specification and incorporated references. All remaining DRAM cells can then be refreshed at a lower rate, reducing negative impacts of latency, bandwidth and power for refresh commands.

Figure 9:
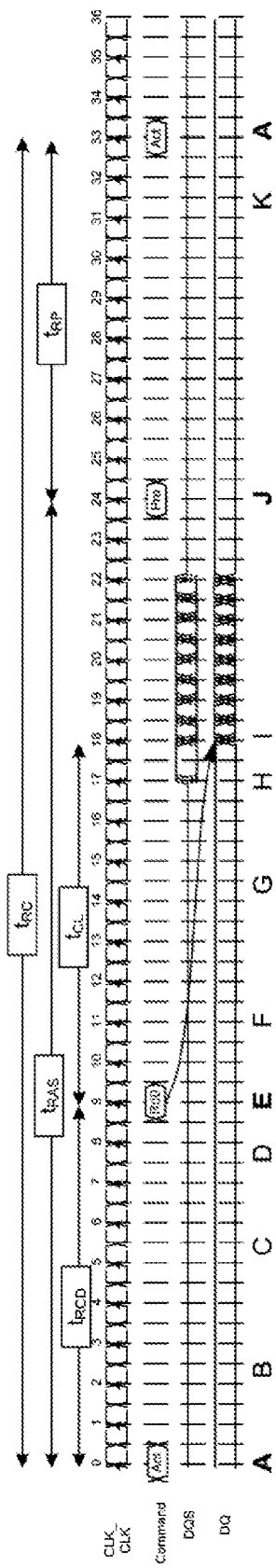
FIG. 9 illustrates a simplified timing diagram according to a conventional memory device.

FIG. 9 illustrates a simplified timing diagram according to a conventional memory device. This timing diagram can be derived from the JEDEC specification. In an embodiment, a goal of the present invention is to map out weak cells with regard to the Write Data Recover Time $t_{WR}$. Even in contemporary DRAM technologies, the present method and system can be used to reduce $t_{WR}$ compared to conventional standards. Weak cells that require longer $t_{WR}$ can be mapped out to reduce the overall $t_{WR}$ for the DIMM (dual in-line memory module). This can potentially help not only the offset potential latency increase due to column address matching in the methods described, but also reduce the overall latency.

Other significant parameters for optimization may include the RAS-to-CAS Delay Time $t_{RCD}$ and the Row Precharge Time $t_{RP}$. Also, it is very likely that the same cells that limit $t_{WR}$ also limit $t_{RCD}$ and by mapping out those cells a lower $t_{RCD}$ can be achieved for the DIMM to reduce read latency. Similarly, it may be possible to further reduce read and write latencies by mapping out cells with weak $t_{WR}$ to reduce $t_{RP}$. Those of ordinary skill in the art will recognize other variations modifications, and alternatives.

In an example, the present invention provides a method for operating a memory interface device, as outlined below.
1. Fabricate a DRAM device having at least refresh specification provided for a DDR3 or DDR4 SDRAM device;
2. Test the DRAM device
3. Determine the refresh characteristic for each memory cell;
4. Classify each of the memory cells as bad or good based on the refresh characteristic;
5. Identify each of the bad memory cells;
6. Store an address location for each of the bad memory cells;
7. Transfer the address location for each of the bad memory cells into an address match table; and
8. Perform other steps, as desired.

As shown, the present method has a sequence of steps, which can be varied, modified, replaced, reordered, expanded, contracted, or any combinations thereof. That is, the method repeats any of the above steps. Such steps may be performed alone or in combination with others, which are described or not even described. The steps can be performed in the order shown or in other orders, if desired. The steps also can be performed using a combination of hardware and software using other process steps. The steps also can be performed using hardware or other processes implemented using software and the like. Of course, there can be many other variations, modifications, and alternatives. Further details of the present method can be found throughout the present specification and more particularly below.

Figure 10:
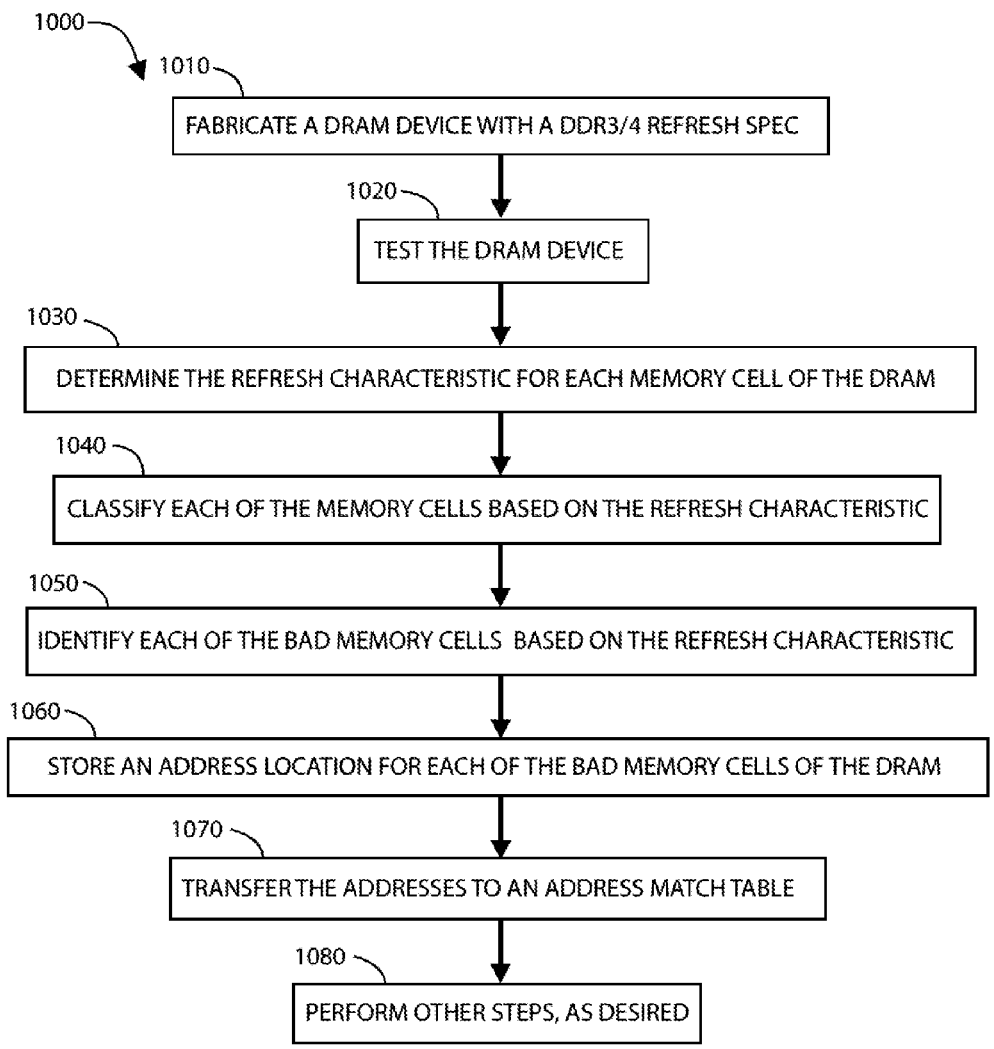
FIG. 10 illustrates a simplified flow diagram of a method for fabricating a dynamic random access memory device according to an embodiment of the present invention.

FIG. 10 illustrates a simplified flow diagram for operating an address match process for replacing a bad cell with a spare cell according to an embodiment of the present invention. As shown, method 1000 can begin with fabricating a DRAM device having a plurality of memory cells, step 1010. Each of the memory cells can have a refresh characteristic that meets or exceeds a refresh specification provided for a DDR3 SDRAM or a DDR4 SDRAM device. The DRAM device can be tested, step 1020. This testing can occur in various phases, such as on an unpackaged DRAM, a packaged DRAM, a memory module, packaged DRAMs in a system, or the like.

The refresh characteristic can be determined for each of the memory cells, step 1030. Each of the memory cells can be classified as a good memory cell or bad memory cell based upon the refresh characteristic, step 1040. The bad memory cells can then be identified, step 1050. An address location of each of these bad memory cells can be stored, step 1060, and transferred to an AMT (Address Match Table), step 1070.

In a specific embodiment, the classification of each of the memory cells can include classifying a first group of bad memory cells according to the refresh specification and classifying a second group of bad memory cells according to a predetermined refresh characteristic range within the refresh specification to form a revised group of bad memory cells. This revised group of bad memory cells can be the sum of the first group and second group, and their addresses can be stored and sent to the AMT.

As described previously, the predetermined refresh characteristic range can relate to a number of timing or refresh characteristics based on the chosen parameter. The range can be characterized by a number of memory cells between a lower end of the range and an upper end of the range where the number of bad memory cells are equal or less to an amount of available memory cells in a group of spare memory cells as well. The address locations of each of the first and second groups of memory cells can be stored in the AMT for cell repair processes. The addresses can be retrieved from the AMT and can be used to reconfigure the memory device based upon the weak cell list using a "repair" or "replacement" method.

In an embodiment, the DRAM device can be an integrated circuit memory interface device coupled to a DRAM device. The DRAM device can include a host memory controller and an SPD module. The method 1000 can further include storing improved parametric values in the SPD module. These values can be based on the memory cells found within the predetermined refresh characteristic range. These improved parametric values can be transferred from the SPD module to the host memory controller, which can schedule commands based on the improved parametric values to improve overall performance of the DRAM device. Of course, other steps can be performed as desired, step 1080.

In an embodiment, the present invention provides a DRAM device comprising a plurality of regular address inputs, at least one spare address input, a plurality of control inputs, a plurality of data inputs, a plurality of data outputs, a plurality of memory arrays, and a spare group of memory cells. Each of the memory arrays can have a plurality of memory cells, each of which can be coupled to a data input and output. The spare group of memory cells can include a plurality of spare memory cells being externally addressable using an AMT and configured with a spare address input. The spare address input can be coupled to the AMT to access the spare memory cells.

Furthermore, the plurality of memory arrays can include a plurality of first and second memory cells and first and second addresses. Each of the first memory cells can have a refresh characteristic outside of a specification for a DRAM device. Each of the second memory cells can have a refresh characteristic within the specification of the DRAM device and outside of a predetermined refresh characteristic range characterized to eliminate accesses to the plurality of second memory cells not meeting the predetermined refresh characteristic range. The first group can be those cells that do not meet conventional specifications, and the second group can be those cells that do not meet the optimization specifications.

In a specific embodiment, the DRAM device can be an integrated circuit memory interface device coupled to a DRAM device. The DRAM device can include a host memory controller and an SPD module. This SPD module can store improved parametric based on the memory cells within the predetermined refresh characteristic range. The host memory controller can be configured to schedule commands based on the improved parametric values stored in the SPD module. These improved parametric values can allow for tighter spacing of the memory commands such that the overall performance of the DRAM device is improved.

In a specific embodiment, the spare group of memory cells can be selected from a spare column, a spare row, or a spare bank. The spare group of memory cells can also include a first through seventh spare column, and the spare address input can include a first through third spare address input. The at least one spare address input can include one of three unused column address inputs A11, A13, and A17.

During the selected mode, at least one of the spare memory cells is accessed from the group of memory cells using the spare address input. During a read operating, data from the accessed spare memory cell is transferred to one of the plurality of data outputs. During a write operation, data from one of the plurality of data inputs is transferred into the accessed spare memory cell. During the unselected mode, the spare address input is inactive, and the plurality of regular address inputs is active. The descriptions provided for FIGS. 1-6 provide further details of related embodiments.

Figure 11:
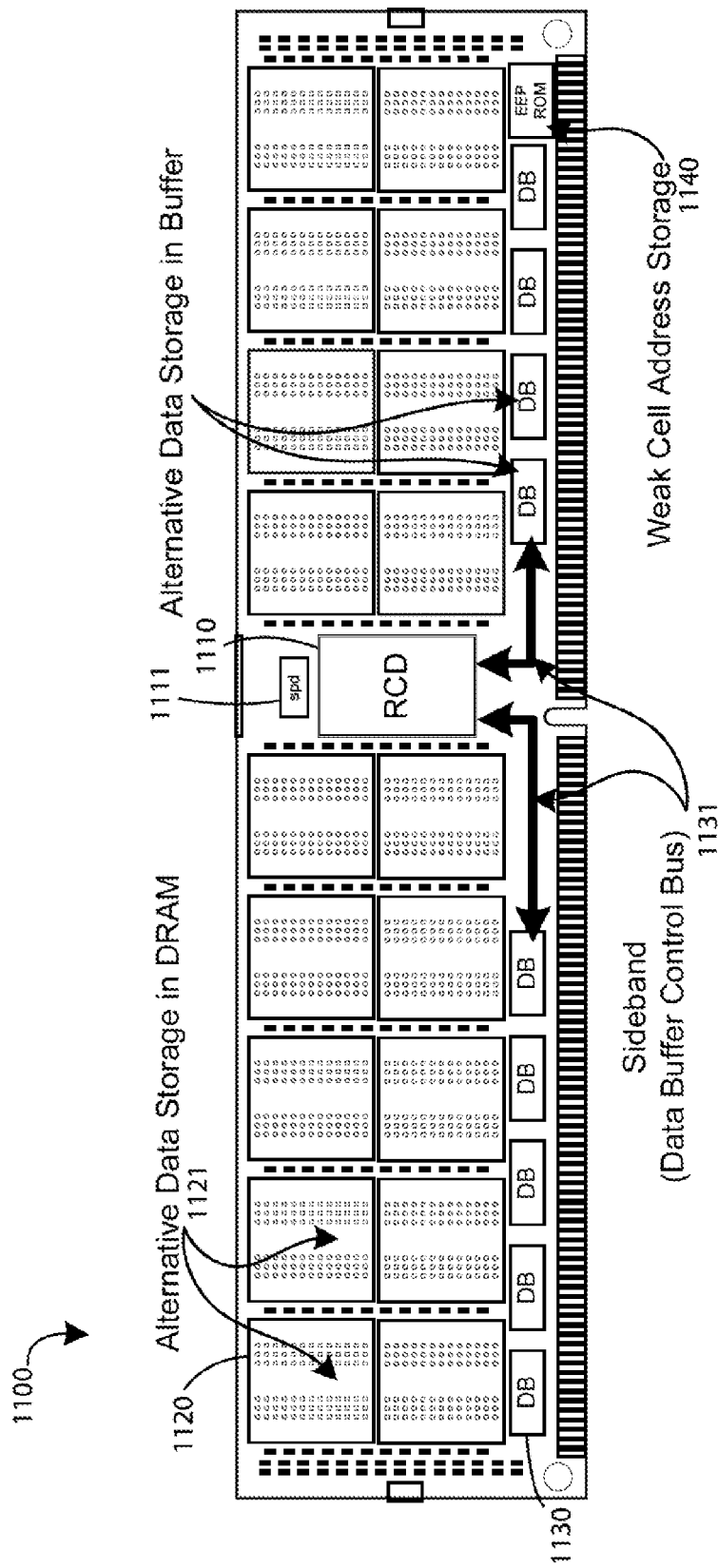
FIG. 11 illustrates a simplified diagram of a memory integrated circuit device according to an embodiment of the present invention.

FIG. 11 illustrates a simplified diagram of a memory integrated circuit device according to an embodiment of the present invention. As shown, device 1100 can include a Registering Clock Driver (RCD) module 1110. The RCD 1110 is coupled to a plurality of memory arrays 1120 and a plurality of data buffers 1130. The data buffers 1130 are coupled to the RCD 1110 via the control buses 1131. The device 1100 includes a serial presence detect (SPD) module 1111, which can contain SPD data to provide a standardized method to access information about the memory module.

The RCD 1110 can include or be coupled to a host controller and an address match table module. As described previously, the memory interface device modules can be provided within the address path of the RCD 1110. Memory module 1140, which can be a non-volatile memory such as an EEPROM (Electrically Erasable Programmable Read-Only Memory), stores the WCL to be loaded into the AMT. With the WCL, bad or weak memory cells can be replaced with spare memory cells 1121 within the memory arrays 1120.

Various example embodiments as described with reference to the accompanying drawings, in which embodiments have been shown. This inventive concept may, however, be embodied in many different forms and should not be construed as limited to the embodiments set forth herein. Rather, these embodiments are provided so that this disclosure is thorough and complete, and has fully conveyed the scope of the inventive concept to those skilled in the art. Like reference numerals refer to like elements throughout this application.

It has been understood that, although the terms first, second, etc. may be used herein to describe various elements, these terms should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It has be understood that when an element is referred to as being "connected" or "coupled" to another element, it can be directly connected or coupled to the other element or intervening elements may be present. In contrast, when an element is referred to as being "directly connected" or "directly coupled" to another element, there may be no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It has been be further understood that terms, such as those defined in commonly used dictionaries, should be interpreted as having a meaning that is consistent with their meaning in the context of the relevant art and will not be interpreted in an idealized or overly formal sense unless expressly so defined herein.

It should be understood that the description recited above is an example of the disclosure and that modifications and changes to the examples may be undertaken which are within the scope of the claimed disclosure. Therefore, the scope of the appended claims should be accorded the broadest interpretation so as to encompass all such modifications and similar arrangements, including a full scope of equivalents.

The invention claimed is:

1. A method for manufacturing a dynamic random access memory device, the method comprising:
    fabricating a dynamic random access memory device having a plurality of memory cells, each of the memory cells having a refresh characteristic that meets or exceeds a refresh specification provided for a DDR3 SDRAM or a DDR4 SDRAM device, the dynamic random access memory device comprising a host memory controller and an SPD module;
    testing the dynamic random access memory device comprising:
        determining the refresh characteristic for each of the memory cells;
        classifying each of the memory cells as a good memory cell or a bad memory cell based upon the refresh characteristic;
        identifying each of the bad memory cells;
        storing an address location for each of the bad memory cells;
    separating the memory cells into bins by retention time characteristics;
    loading into an Erasable Programmable Read Only Memory (EPROM) device on boot time by a memory buffer, a linked-list structure pointing to a next bin to be refreshed according to the retention time characteristics;
    refreshing the bins according to traversal of the linked list structure;

transferring the address location for each of the bad memory cells into an address match table;
storing improved parametric values based on the memory cells within the predetermined refresh characteristic range in the SPD module;
transferring the improved parametric values from the SPD module to the host memory controller; and
scheduling commands with a tighter spacing based on the improved parametric values.

2. The method of claim 1 wherein the classifying each of the memory cells comprises classifying a first group of bad memory cells according to the refresh specification and classifying a second group of bad memory cells according to a predetermined refresh characteristic range within the refresh specification to form a revised group of bad memory cells, the revised group of bad memory cells being a sum of the first group of bad memory cells and the second group of bad memory cells; and storing an address location for each of the revised group of bad memory cells.

3. The method of claim 1 wherein the testing is provided on an unpackaged dynamic random access memory.

4. The method of claim 1 wherein the testing is provided on a packaged dynamic random access memory.

5. The method of claim 1 wherein the testing is provided on a memory module.

6. The method of claim 1 wherein the testing is provided on packaged dynamic random access memories in a system.

7. The method of claim 1 wherein the classifying each of the memory cells comprises classifying a first group of bad memory cells according to the refresh specification and classifying a second group of bad memory cells according to a predetermined refresh characteristic range within the refresh specification; wherein the predetermined refresh characteristic is characterized by a number of memory cells between a lower end of the range and an upper end of the range where the number of bad memory cells being equal or less to an amount of available memory cells in a group of spare memory cells.

8. The method of claim 7 further comprising storing an address location of each of the first group of memory cells and the second group of memory cells in an address match table.

9. The method of claim 1 further comprising using the address match table to reconfigure a memory device.

10. The method of claim 1 further comprising retrieving address information from the address match table.

11. The method of claim 1 wherein the predetermined refresh characteristic is characterized by a refresh time.

12. The method of claim 1 wherein the predetermined refresh characteristic is characterized by a predetermined requirement for a RAS-to-CAS Delay Time $t_{RCD}$, a Row Precharge Time $t_{RP}$, or a Write Data Recover Time $t_{WR}$.

13. The method of claim 1 wherein the predetermined refresh characteristic range is characterized to prioritize accesses to memory cells having improved parametric values.

14. A dynamic random access memory device comprising:
a plurality of regular address inputs;
at least one spare address input configured for a selected mode or an unselected mode;
a plurality of control inputs;
a plurality of data inputs;
a plurality of data outputs;
a plurality of memory arrays, each of the memory arrays comprising a plurality of memory cells, each of the plurality of memory cells being coupled to a data input/output; and
a spare group of memory cells comprising a plurality of spare memory cells, each of the plurality of spare memory cells being externally addressable using an address match table and configured with a spare address input; whereon the spare address input is coupled to the address match table to access the spare memory cells;
whereupon the plurality of memory arrays comprising:
a plurality of first memory cells and first addresses, each of the first memory cells having a refresh characteristic outside of a specification for a DRAM device;
a plurality of second memory cells and second addresses, each of the second memory cells having a refresh characteristic within the specification of the DRAM device and outside of a predetermined refresh characteristic range characterized to eliminate accesses to the plurality of second memory cells not meeting the predetermined refresh characteristic range;
a host memory controller;
a plurality of memory cells separated into bins by retention time characteristics;
an Erasable Programmable Read Only Memory (EPROM) device storing a linked-list structure loaded on boot time by a memory buffer, the linked-list structure pointing to a next block to be refreshed according to the retention time characteristics; and
an SPD module storing improved parametric values based on the memory cells within the predetermined refresh characteristic range,
wherein the host memory controller is configured to schedule commands with a tighter spacing based on the improved parametric values stored in the SPD module.

15. The device of claim 14 wherein the spare group of memory cells is selected from a spare column, a spare row, or a spare bank.

16. The device of claim 14 wherein the at least one spare address input comprises one of three unused column address inputs A11, A13, and A17.

17. The device of claim 14 wherein during the selected mode at least one of the spare memory cells being accessed from the group of memory cells using the spare address input; whereupon during a read operation data from the accessed spare memory cell is transferred to one of the plurality of data outputs; or whereupon during a write operation data from one of the plurality of data inputs is transferred into the accessed spare memory cell.

18. The device of claim 14 wherein during the unselected mode the spare address input is inactive; and wherein the plurality of regular address inputs is active.

19. The device of claim 14 wherein the spare group of memory cells comprises a first spare column, a second spare column, a third spare column, a fourth spare column, a fifth spare column, a sixth spare column, and a seventh spare column; wherein the at least one spare address input comprises a first spare address input, a second spare address input, and a third spare address input.

20. The device of claim 14 wherein the predetermined refresh characteristic is a refresh time.

21. The device of claim 14 wherein the predetermined refresh characteristic is characterized by a predetermined requirement for a RAS-to-CAS Delay Time $t_{RCD}$, a Row Precharge Time $t_{RP}$, or a Write Data Recover Time $t_{WR}$.

22. The device of claim 14 wherein the predetermined refresh characteristic range is characterized to prioritize accesses to memory cells having improved parametric values.

* * * * *